United States Patent
Wu et al.

(10) Patent No.: US 10,276,378 B1
(45) Date of Patent: Apr. 30, 2019

(54) METHOD OF FORMING FUNNEL-LIKE OPENING FOR SEMICONDUCTOR DEVICE STRUCTURE

(71) Applicant: Taiwan Semiconductor Manufacturing Co., Ltd., Hsinchu (TW)

(72) Inventors: Ying-Hao Wu, Taoyuan (TW); Chao-Kuei Yeh, Changhua (TW); Tai-Yen Peng, Hsinchu (TW); Yun-Yu Chen, New Taipei (TW); Jiann-Horng Lin, Hsinchu (TW); Chih-Hao Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/797,873

(22) Filed: Oct. 30, 2017

(51) Int. Cl.
*H01L 21/027* (2006.01)
*H01L 21/033* (2006.01)
(Continued)

(52) U.S. Cl.
CPC ...... *H01L 21/0337* (2013.01); *H01L 21/0332* (2013.01); *H01L 21/0335* (2013.01);
(Continued)

(58) Field of Classification Search
CPC ............. H01L 21/0338; H01L 21/0332; H01L 21/0337; H01L 21/0335; H01L 21/0274; H01L 21/0276; H01L 21/31122; H01L 21/31138; H01L 21/31144; H01L 21/76802; H01L 21/76879; H01L 21/3081; H01L 21/3085–21/3088; H01L 21/76811;
(Continued)

(56) References Cited

U.S. PATENT DOCUMENTS 5,203,957 A * 4/1993 Yoo .................. H01L 21/31116
204/192.32
5,453,403 A * 9/1995 Meng ................ H01L 21/76804
257/E21.578

(Continued)

OTHER PUBLICATIONS

U.S. Appl. No. 15/641,009, filed Jul. 3, 2017, invented by Tai-Yen Peng.

*Primary Examiner* — Errol V Fernandes
*Assistant Examiner* — Jeremy J Joy
(74) *Attorney, Agent, or Firm* — McClure, Qualey & Rodack, LLP

(57) ABSTRACT

A method of forming a semiconductor device structure is provided. The method includes successively forming first and second hard mask layers over a trench pattern region of a material layer. The second hard mask layer has a first tapered opening corresponding to a portion of the trench pattern region and a passivation spacer is formed on a sidewall of the first tapered opening to form a second tapered opening therein. The method also includes forming a third tapered opening below the second tapered opening and removing a portion of the passivation spacer in a first etching process. The method also includes forming a vertical opening in the first hard mask layer below the bottom of the third tapered opening in a second etching process. The vertical opening has a width that is substantially equal to a bottom width of the third tapered opening.

20 Claims, 12 Drawing Sheets

(51) Int. Cl.
  *H01L 21/311* (2006.01)
  *H01L 21/768* (2006.01)
(52) U.S. Cl.
  CPC .... *H01L 21/0338* (2013.01); *H01L 21/31122* (2013.01); *H01L 21/31138* (2013.01); *H01L 21/31144* (2013.01); *H01L 21/76802* (2013.01); *H01L 21/76879* (2013.01); *H01L 21/0274* (2013.01); *H01L 21/0276* (2013.01)
(58) Field of Classification Search
  CPC ......... H01L 21/76804; H01L 21/76816; H01L 21/823475; H01L 21/76897
  See application file for complete search history.

(56) References Cited

U.S. PATENT DOCUMENTS

| | | | | |
|---|---|---|---|---|
| 5,767,018 A * | 6/1998 | Bell | ............... | H01L 21/32135 257/E21.31 |
| 5,841,196 A * | 11/1998 | Gupta | ............... | H01L 21/76804 257/774 |
| 5,914,280 A * | 6/1999 | Gelzinis | ............... | H01L 21/30604 257/E21.027 |
| 5,940,732 A * | 8/1999 | Zhang | ............... | H01L 21/31111 257/E21.251 |
| 6,674,032 B2 * | 1/2004 | Pfenninger | ............... | G08B 25/12 200/300 |
| 6,774,032 B1 * | 8/2004 | Park | ............... | H01L 21/76804 257/E21.577 |
| 7,297,628 B2 * | 11/2007 | Chao | ............... | H01L 21/76816 438/635 |
| 8,105,949 B2 * | 1/2012 | Honda | ............... | H01L 21/0212 438/695 |
| 8,273,658 B2 * | 9/2012 | Goller | ............... | H01L 21/76804 438/622 |
| 8,883,648 B1 * | 11/2014 | Hsieh | ............... | H01L 21/76802 257/E23.011 |
| 9,917,027 B2 * | 3/2018 | Yi | ............... | H01L 23/3192 |
| 2006/0000796 A1 * | 1/2006 | Tan | ............... | H01L 21/31116 216/37 |
| 2006/0148245 A1 * | 7/2006 | Kim | ............... | H01L 21/76804 438/640 |
| 2009/0035944 A1 * | 2/2009 | Chiang | ............... | H01L 21/02063 438/703 |
| 2009/0191711 A1 * | 7/2009 | Rui | ............... | G03F 7/40 438/695 |
| 2010/0216314 A1 * | 8/2010 | Honda | ............... | H01L 21/0212 438/737 |
| 2011/0008956 A1 * | 1/2011 | Lee | ............... | H01L 21/0337 438/618 |
| 2011/0174774 A1 * | 7/2011 | Lin | ............... | G03F 7/40 216/41 |
| 2012/0244710 A1 * | 9/2012 | Chumakov | ............... | H01L 21/0337 438/701 |
| 2012/0315748 A1 * | 12/2012 | Chang | ............... | H01L 21/31122 438/585 |
| 2013/0137269 A1 * | 5/2013 | Geiss | ............... | H01L 21/0337 438/697 |
| 2014/0145313 A1 * | 5/2014 | Li | ............... | H01L 21/31116 257/635 |

\* cited by examiner

METHOD OF FORMING FUNNEL-LIKE OPENING FOR SEMICONDUCTOR DEVICE STRUCTURE

BACKGROUND

The semiconductor industry has experienced rapid growth, and demands for highly integrated semiconductor devices are increasing. Technological advances in integrated circuit (IC) design and materials have produced generations of ICs. Each generation has smaller and more complex circuits than previous generations. In the course of IC evolution, functional density has generally increased while geometric size (i.e., the smallest component (or line) that can be created through a fabrication process) has decreased.

These demands for scaling down have increased the complexity of processing and manufacturing semiconductor devices for ICs. For example, as the critical dimension (CD) of features for ICs is scaled down, it may be difficult to form these features having the desired CD using conventional lithography processes because the wavelength of the light used in these lithography processes is reaching its technical limitations. For such demands to be met, similar developments in IC processing and manufacturing are needed.

Although existing methods for fabricating IC devices have been generally adequate for their intended purposes, they have not been entirely satisfactory in every respect. Improved techniques for multiple patterning may relax existing design rules, overcome existing limitations, and thereby enable even more robust circuit devices to be manufactured.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
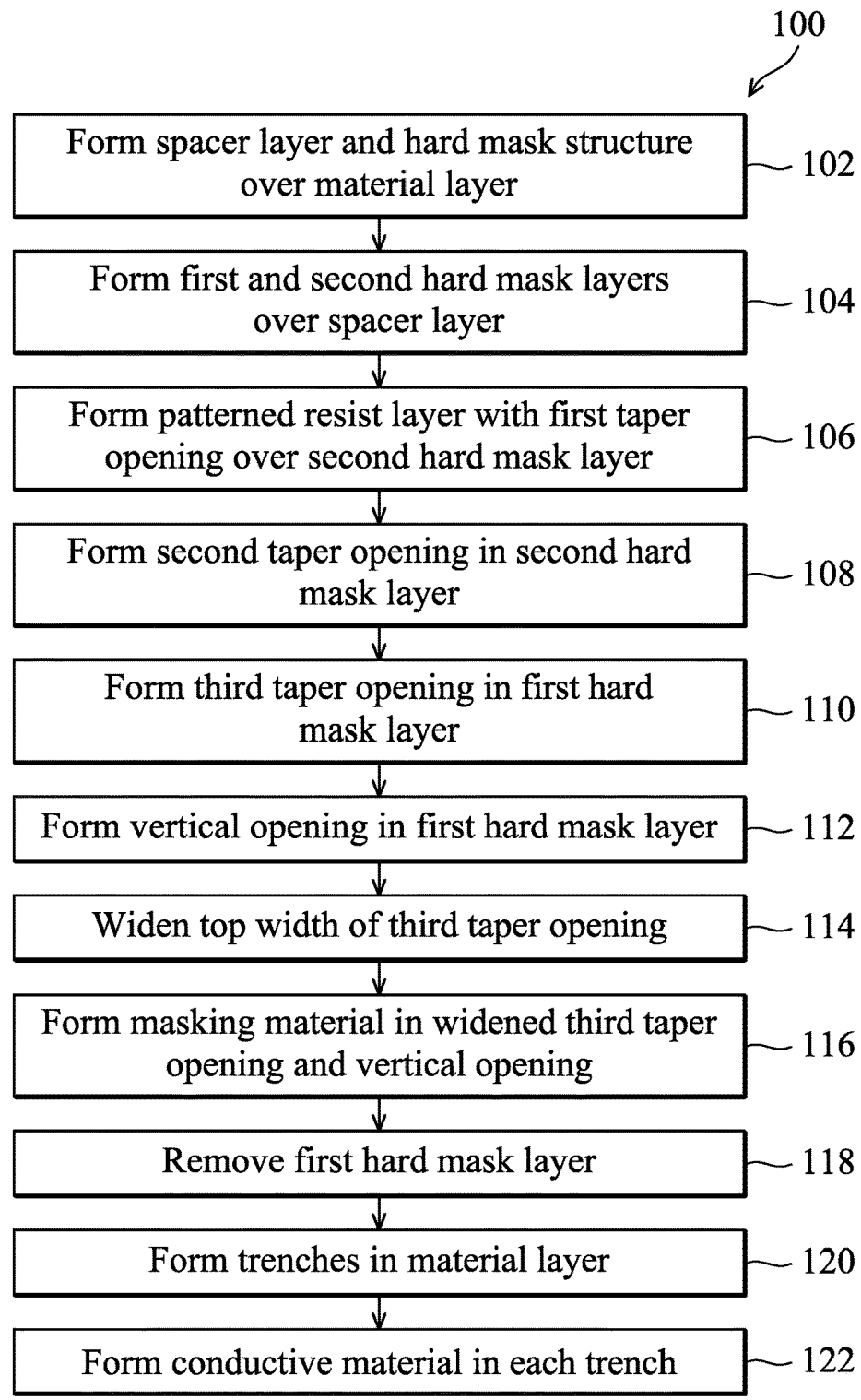
FIG. 1 is a flowchart of an example method of forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Methods for forming a semiconductor device structure are provided in accordance with exemplary embodiments. The intermediate stages of forming the semiconductor device structure in accordance with embodiments are illustrated.

Some embodiments of the disclosure are described. FIG. 1 is a flowchart of a method 100 of forming one or more semiconductor device structures in accordance with some embodiments. The method 100 is discussed in detail below with reference to a semiconductor device structure, shown in FIGS. 2A through 2K. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 2A:
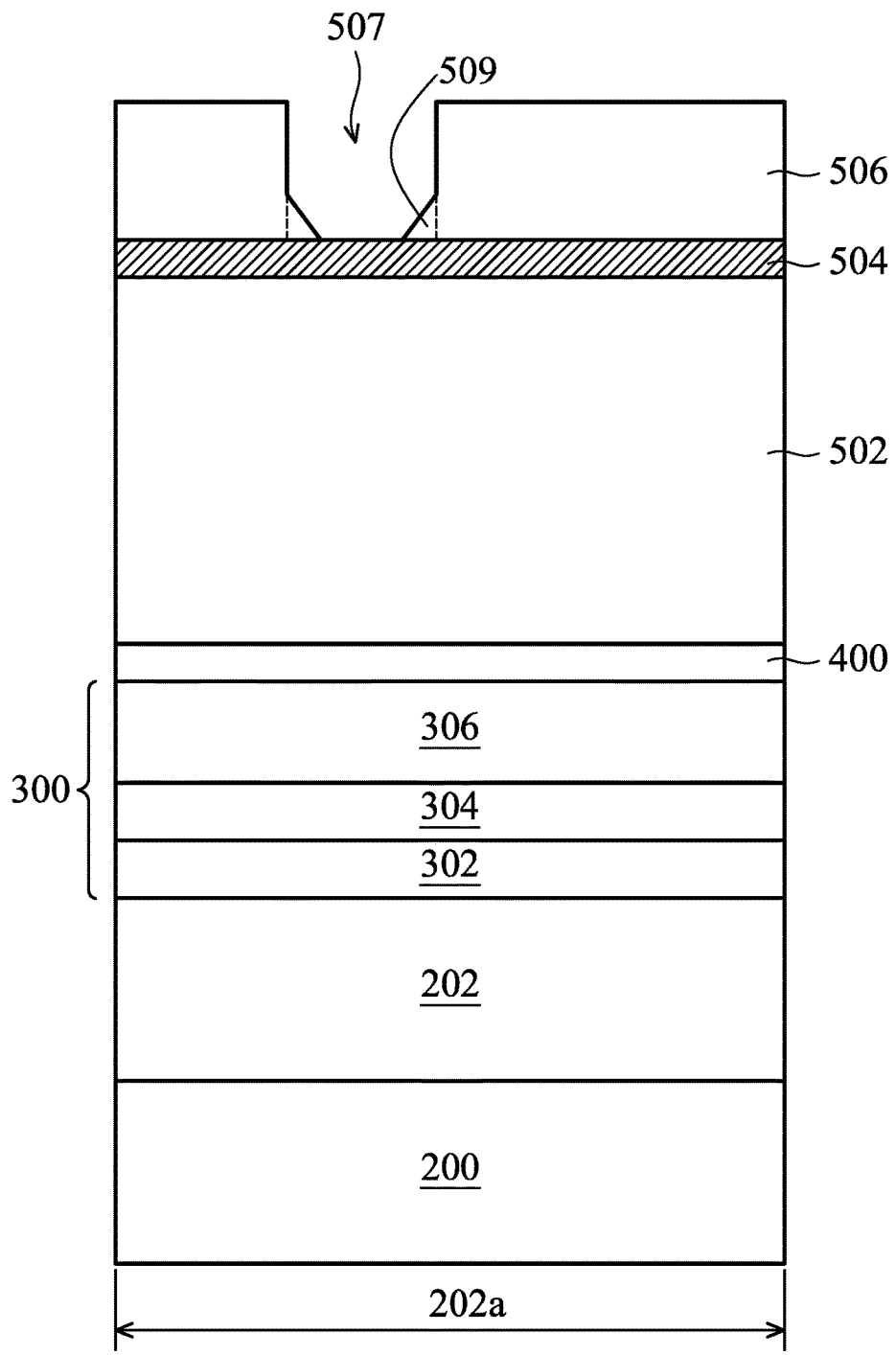
FIGS. 2A to 2K are cross-sectional views of an example method of forming a semiconductor device structure, in accordance with some embodiments.

Referring to FIGS. 1 and 2A, the method 100 begins at step 102 by forming a material layer 202 over a substrate 200, forming a hard mask stack 300 over the material layer 202, and forming a spacer layer 400 over the hard mask stack 300. In some embodiments, the substrate 200 may be a bulk silicon substrate. Alternatively, the substrate 200 may include an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. In some other embodiments, the substrate 200 also includes a silicon-on-insulator (SOI) substrate. The SOI substrate may be fabricated using separation by implantation of oxygen (SIMOX), wafer bonding, and/or other suitable methods.

In accordance with some embodiments, the substrate 200 also includes various p-type doped regions and/or n-type doped regions, implemented by a process such as ion implantation and/or diffusion. For example, those doped regions may include n-well, p-well, light doped region (LDD), and doped source and drain (S/D) configured to form various integrated circuit (IC) devices, such as a complimentary metal-oxide-semiconductor field-effect transistor (CMOSFET), imaging sensor, and/or light emitting diode (LED).

The substrate 200 further includes other functional features such as a resistor or a capacitor formed in and on the substrate, in accordance with some embodiments. The substrate 210 may also include various isolation features. The isolation features separate various device regions in the substrate 200. The isolation features include different structures formed by using different processing technologies. For example, the isolation features may include shallow trench isolation (STI) features. The formation of a STI may include etching a trench in the substrate 200 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features.

The substrate 200 also includes gate stacks formed by dielectric layers and electrode layers, in accordance with some embodiments. The dielectric layers may include an interfacial layer (IL) and a high-k dielectric layer deposited by suitable techniques, such as chemical vapor deposition (CVD), atomic layer deposition (ALD), physical vapor deposition (PVD), thermal oxidation, combinations thereof, or other suitable techniques. The electrode layers may include a single layer or multi-layers, such as metal layer, liner layer, wetting layer, and adhesion layer, formed by ALD, PVD, CVD, and/or another suitable process.

The substrate 200 also includes a plurality of inter-level dielectric (ILD) layers and conductive features integrated to form an interconnect structure configured to electrically couple the various p-type and n-type doped regions and the other functional features (such as gate electrodes), resulting a functional integrated circuit, in accordance with some embodiments.

In accordance with some embodiments, the material layer 202 is an inter-metal dielectric (IMD) layer, which is formed of a dielectric material having a dielectric constant (k value) lower than about 3.8, lower than about 3.0, or lower than about 2.5. In alternative embodiments, the material layer 202 is formed of a dielectric layer including silicon oxide, borosilicate glass (BSG), phosphoric silicate glass (PSG), borophosphosilicate glass (BPSG), fluorinated silicate glass (FSG), tetraethyl orthosilicate (TEOS) oxide, or a combination thereof. The material layer 202 formed of a dielectric material may be formed by a spin-on process, a CVD process (such as a low-pressure CVD (LPCVD) process, a plasma-enhanced CVD (PECVD) process, or a high-density plasma CVD (HDPCVD) process), an ALD process, or another suitable method. In accordance with some embodiments, the material layer 202 may be referred to as a target layer, which is to be etched and has a target pattern region. For example, the material layer 202 includes a trench pattern region 202a. In some other embodiments, the target pattern of the target layer further includes via holes, or the like.

In accordance with some embodiments, the hard mask structure 300 is formed over the material layer 202 and the spacer layer 400 is formed over the hard mask structure 300. The hard mask structure 300 may be a single layer or a multi-layer structure. For example, the hard mask structure 300 may be a multi-layer structure including a first hard mask layer 304 and a second hard mask layer 306 over the first hard mask layer 304. In some embodiments, the first hard mask layer 304 has a thickness that is in a range from about 50 nm to 500 nm and includes a metal or metal nitride material, such as titanium (Ti), titanium nitride (TiN), tantalum (Ta), tantalum nitride (TaN), aluminum nitride (AlN) or the like. In these cases, the first hard mask layer 304 may be formed by a PVD process (such as radio frequency PVD (RFPVD)), an ALD process, a CVD process, or another suitable method.

In some embodiments, the second hard mask layer 306 over the first hard mask layer 304 has a thickness that is in a range from about 50 nm to 500 nm and includes a dielectric material including silicon oxide (such as TEOS oxide), metal oxide (such as HfO, AlO$_x$, TiO$_x$), or silicon carbide. The second hard mask layer 306 may be formed by a PVD process (such as RFPVD), an ALD process, a CVD process, or another suitable method.

In some embodiments, the hard mask structure 300 further includes a third hard mask layer 302 below the first hard mask layer 304. For example, the third hard mask layer 302 may be a nitrogen-free anti-reflection coating (NFARC) layer (such as silicon oxide, silicon oxygen carbide, or the like) that may be formed by PECVD, HDPCVD, or the like.

In alternative embodiments, the hard mask structure 300 is a single layer including a metal nitride (such as AlN, TiN, or TaN), a metal oxide (such as HfO, AlO$_x$, TiO$_x$), silicon carbide, or the like. In these cases, the formation methods may include a PVD process (such as RFPVD), an ALD process, a CVD process (such as PECVD or HDPCVD), or another suitable method.

To achieve etching selectivity during subsequent etch processes, the second hard mask layer 306 may include a material which is different from the first hard mask layer 304, the third hard mask layer 302 may include a material which is different from the first hard mask layer 304.

In accordance with some embodiments, the spacer layer 400 is made of a dielectric material including metal nitride (such as AlN, TiN, or TaN), metal oxide (such as HfO, AlO$_x$, TiO$_x$), or the like. The spacer layer 400 may be formed by a PVD process (such as RFPVD), an ALD process, a CVD process, or another suitable method.

In the present embodiment, a plurality of features (e.g. trenches) is formed in the material layer 202 in subsequent processes. Typically, trenches are formed in the material layer 202 by successively forming a hard mask structure (e.g., the hard mask structure 300) and a spacer layer (e.g., the spacer layer 400) over the material layer 202, then form spacers and pattern the hard mask structure and then etch the material layer 202 through the spacers and the patterned hard mask structure. It is often that trenches with various lengths are needed. In particular, when device sizes scale down, a process is typically performed to separate a trench into two sub-trenches, which is sometimes referred to as a trench cut process. However, when such a process is performed, it becomes harder to minimize the process-induced-damage on the hard mask structure. In the present embodiment, method 100 minimizes the process-induced-damage on the hard mask structure 300 while performing such a process, thereby ensuring that the trench can be separated into two sub-trenches.

As shown in FIGS. 1 and 2A again, the method 100 proceeds to step 104 by successively depositing a first hard mask layer 502 and a second hard mask layer 504 over the spacer layer 400. In accordance with some embodiments, a resist layer 506 with a thickness which is in a range from about 600 Å to 1000 Å is coated over the second hard mask layer 504, so as to define an opening in the first hard mask layer 502 and the second hard mask layer 504 and corresponding to a portion of the trench pattern region 202a of the material layer 202 for placement of a sacrificial layer. In accordance with some embodiments, the sacrificial layer is used for protecting the underlying hard mask structure 300 from the process-induced-damage during pattern the hard mask structure 300 and the underlying material layer 202.

Moreover, the first hard mask layer 502 protects the spacer layer 400 and the hard mask structure 300 in a subsequent etch process. In some embodiments, the first hard mask layer 502 includes a carbon-containing layer or an organic polymer free of silicon. Moreover, the second hard mask layer 504 may include a silicon-containing layer designed to provide etch selectivity from the first hard mask layer 502. In some embodiments, the second hard mask layer 504 is also designed to function as a bottom anti-reflective coating that reduces reflection during a lithography exposure process. In some embodiments, the first hard mask layer 502 has a thickness that is in a range from about 1000 Å to 1300 Å and the second hard mask layer 504 has a thickness that is in the range from about 250 Å to 350 Å.

As shown in FIGS. 1 and 2A, the resist layer 506 is patterned to form an opening 507 therein and corresponding to a portion of the trench pattern region 202a of the material layer 202 using a lithography process, in accordance with some embodiments. After forming the opening 507, residual resist 509 (which is sometimes referred to as scum) may be formed around the lower sidewall of the opening 507.

Figure 2B:
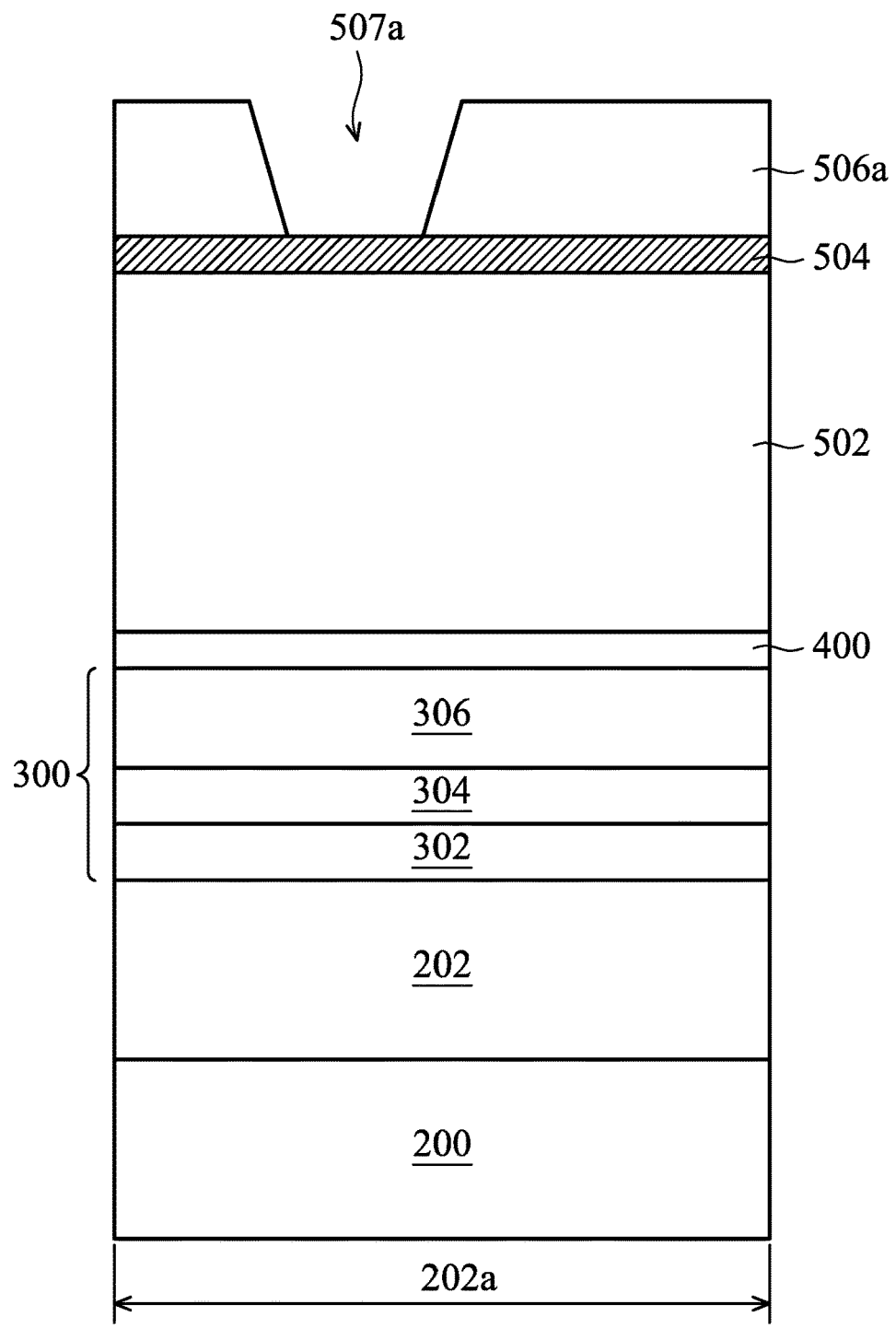

As shown in FIGS. 1 and 2B, the method 100 proceeds to step 106 by forming a patterned resist layer 506a with a first tapered opening 507a over the second hard mask layer 504 and corresponding to a portion of the trench pattern region 202a of the material layer 202. For example, a descum process may be performed on the resist layer 506 using a process gas including a fluorocarbon-containing gas (such as $CF_4$, $C_3F_8$, $C_4F_8$, $CH_2F_2$, $CHF_3$, or the like) and an inert gas (such as argon (Ar) or nitrogen ($N_2$)) to remove the undesired residual resist 509 and form the first tapered opening 507a. In some embodiments, the process gas for the descum process includes $CF_4$ and Ar gases, in which a flow rate of the $CF_4$ gas is in a range from about 50 sccm to 100 sccm and that of the Ar gas is in a range from about 100 sccm to 200 sccm. In those cases, the gas-flow ratio between Ar gas and $CF_4$ gas may be about 2. In some embodiments, the first tapered opening 507a has a width greater than that of the opening 507 because a portion of the sidewall of the opening 507 may be also removed during the descum process.

Figure 2C:
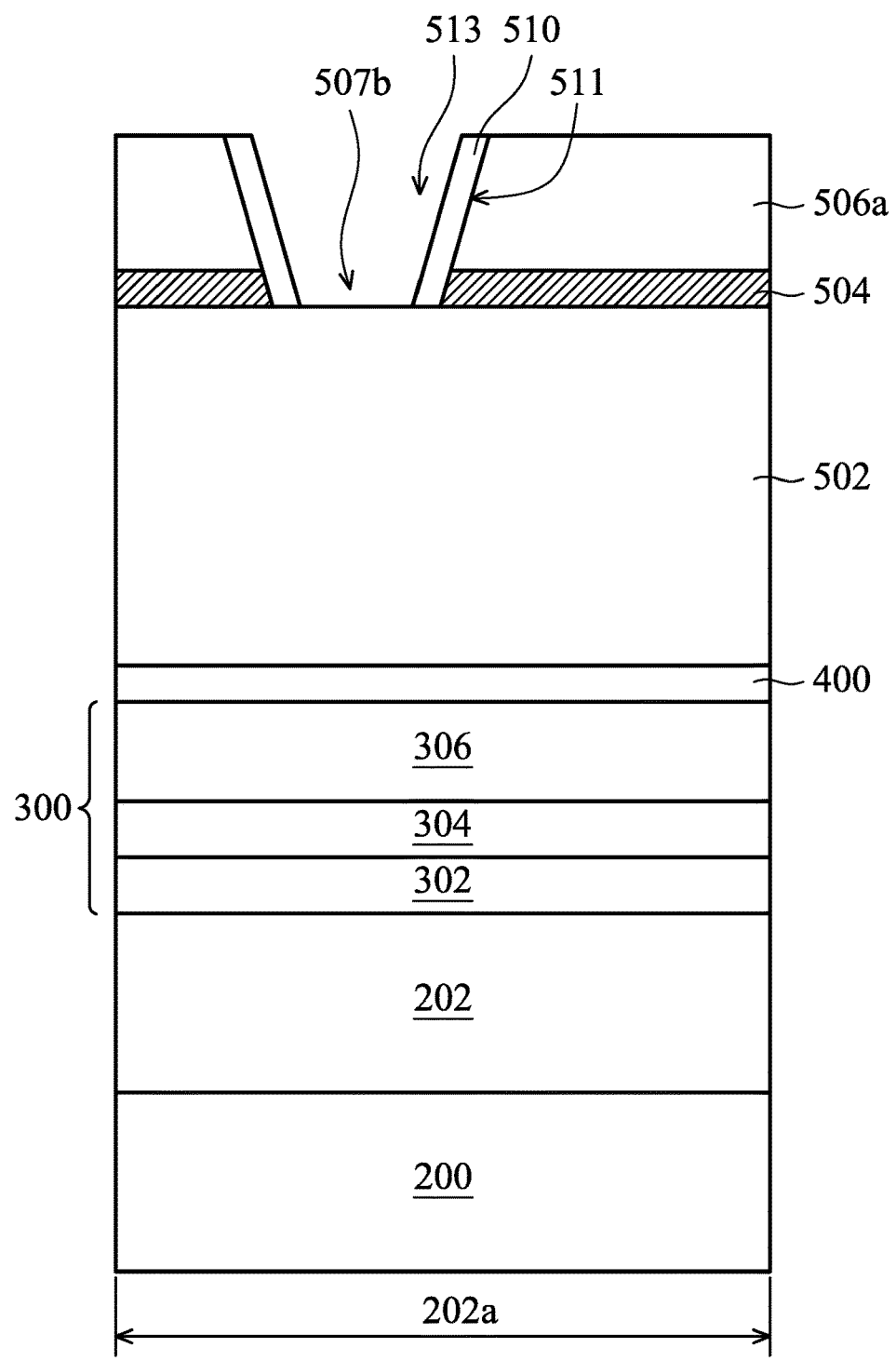

As shown in FIGS. 1 and 2C, the method 100 proceeds to step 108 by extending the first tapered opening 507a shown in FIG. 2B into the second hard mask layer 504 and forming a passivation spacer 510 on a sidewall 511 of the extended first tapered opening 507b by a first plasma process, so as to form a second tapered opening 513 surrounded by the passivation spacer 510 and corresponding to a portion of the trench pattern region 202a of the material layer 202. In some embodiments, the first plasma process includes etching and deposition, so as to etch the second hard mask layer 504 and deposit the passivation spacer 510. In some embodiments, the first plasma process is performed using first and second process gases including fluorocarbon (such as $CF_4$, $C_3F_8$, $C_4F_8$, $CH_2F_2$, $CHF_3$, or the like). For example, the first process gas for the first plasma process includes $CF_4$ and the second process gas for the first plasma process includes $C_4F_8$, in which a flow rate of the $CF_4$ gas is in a range from about 105 sccm to 210 sccm and that of the $C_4F_8$ gas is in a range from about 15 sccm to 30 sccm. In those cases, the gas-flow ratio between the first process gas and the second process gas may be about 7. In some embodiments, the passivation spacer 510 narrows the width of the first tapered opening 507a shown in FIG. 2B, so that the formed second tapered opening 513 has a bottom width that is between the width of the first tapered opening 507a shown in FIG. 2B and the width of the opening 507 shown in FIG. 2A. In alternative embodiments, the passivation spacer 510 has a bottom width that is substantially equal to that the opening 507 shown in FIG. 2A. In some embodiments, the passivation spacer 510 may be formed of a polymer containing silicon, carbon, and fluorine.

Figure 2D:
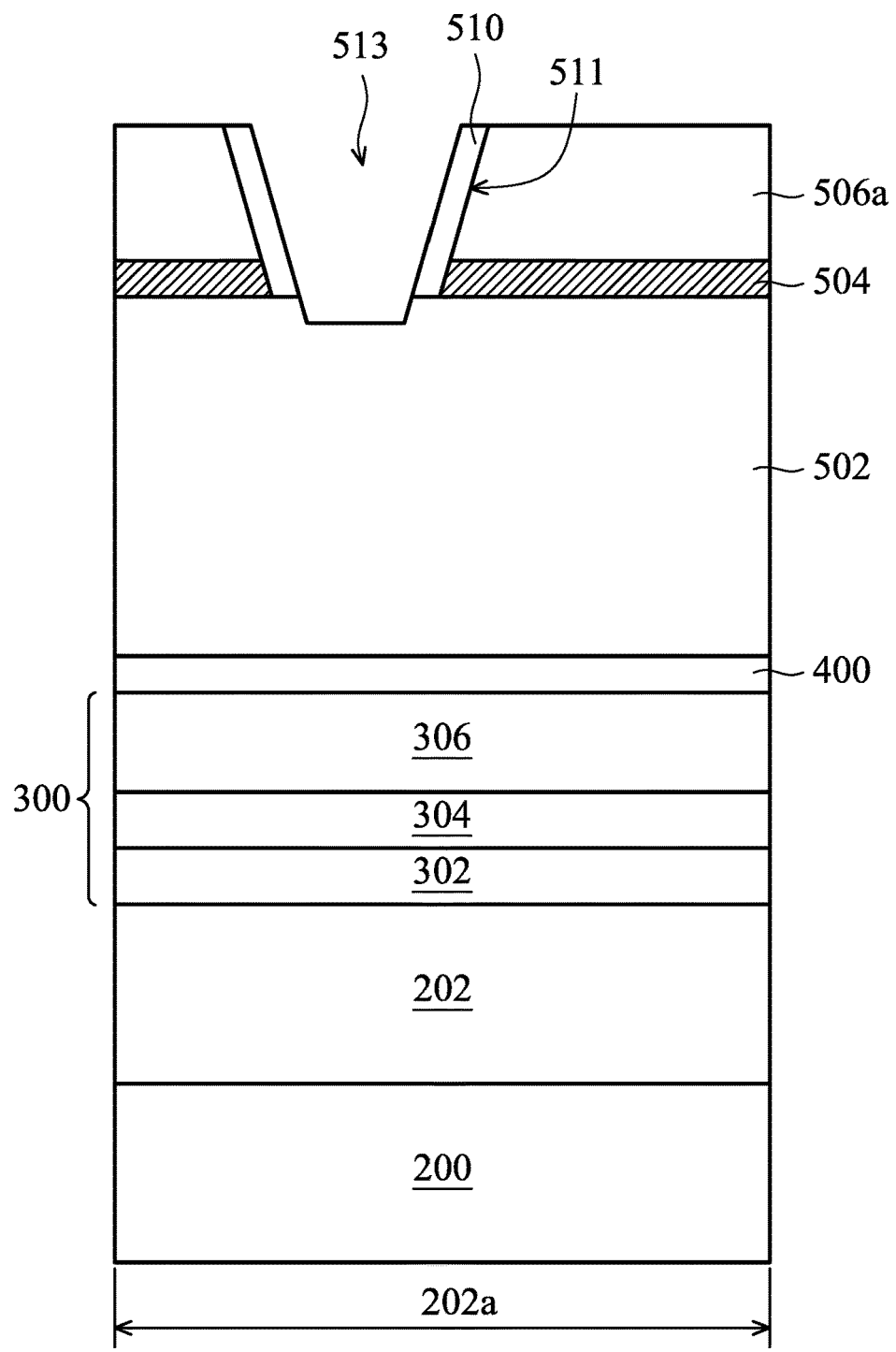

In some embodiments, to ensure that the second tapered opening 513 passes through the second hard mask layer 504, an over-etching step may be provided after performing the first plasma process and thus the surface of the first hard mask layer 502 may be slightly recessed, as shown in FIG. 2D. For example, the over-etching step may be provided by performing a second plasma process using process gases including fluorocarbon (such as $CF_4$, $C_3F_8$, $C_4F_8$, $CH_2F_2$, $CHF_3$, or the like). In some embodiments, the second plasma process uses the process gases that are the same as those used in the first plasma process. Moreover, a gas-flow ratio between the first and second process gases used in the first plasma process is lower than that used in the second plasma process, so that the fluorine-to-carbon ratio in the process gases for the second plasma process is higher than that the process gases for the first plasma process. For example, the first process gas (e.g., $CF_4$ gas) for the second plasma process has a flow rate in a range from about 200 sccm to 300 sccm and the second process gas (e.g., $C_4F_8$ gas) for the second plasma process has a flow rate that is in a range from about 10 sccm to 15 sccm. In those cases, the gas-flow ratio between the first process gas and the second process gas may be about 20.

Figure 2E:
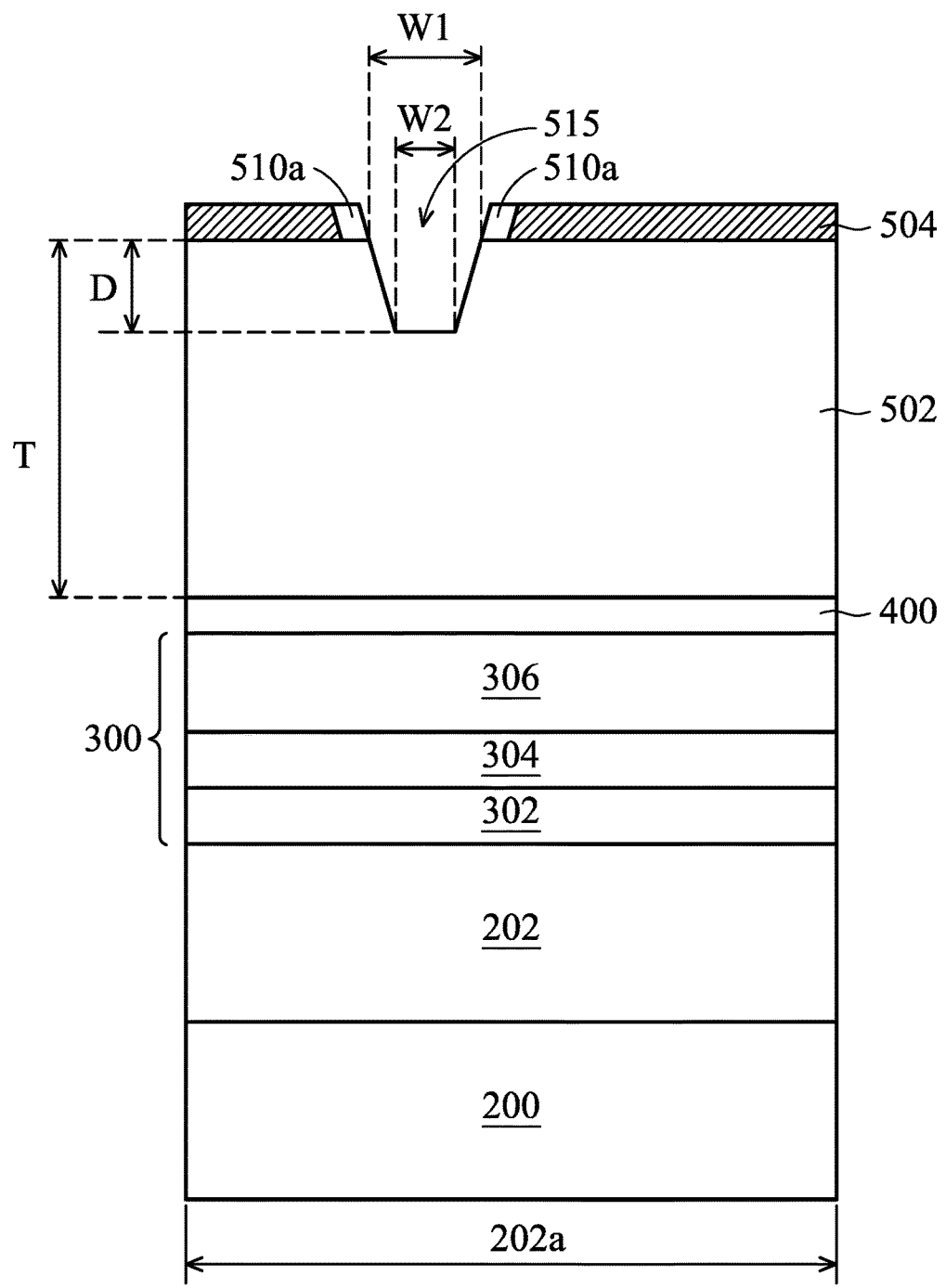

As shown in FIGS. 1 and 2E, the method 100 proceeds to step 110 by removing a portion of the first hard mask layer 502 below the second tapered opening 513, the patterned resist layer 506a, and a portion of the passivation spacer 510 by a first etching process, so as to form a third tapered opening 515 with a top width W1 and a bottom width W2 narrower than the top width W1 in the first hard mask layer 502. In some embodiments, the patterned resist layer 506a and a portion of the passivation spacer 510 are removed by the first etching process after performing the second plasma process. The second hard mask layer 504 and the remained passivation spacer 510a are used as an etch mask in the first etching process, so as to remove a portion of the first hard mask layer 502 and form the third tapered opening 515. In some embodiments, the first etching process uses a third process gas including oxygen (such as $O_2$, $CO_2$, or the like). For example, the first etching process uses $O_2$ gas as the third process gas that helps to remove polymer (e.g., the passivation spacer 510) formed during the first and second plasma processes. However, the third tapered opening 515 may be easier to get lateral etched by the first etching process using $O_2$ gas as the third process gas. Therefore, in some embodiments, the third tapered opening 515 has a depth D that is controlled by the etching time of the first etching process. For example, the depth D is in a range from about 200 Å to 260 Å, so that a ratio of the thickness T of the first hard mask layer 502 to the depth D is about 5.

Figure 2F:
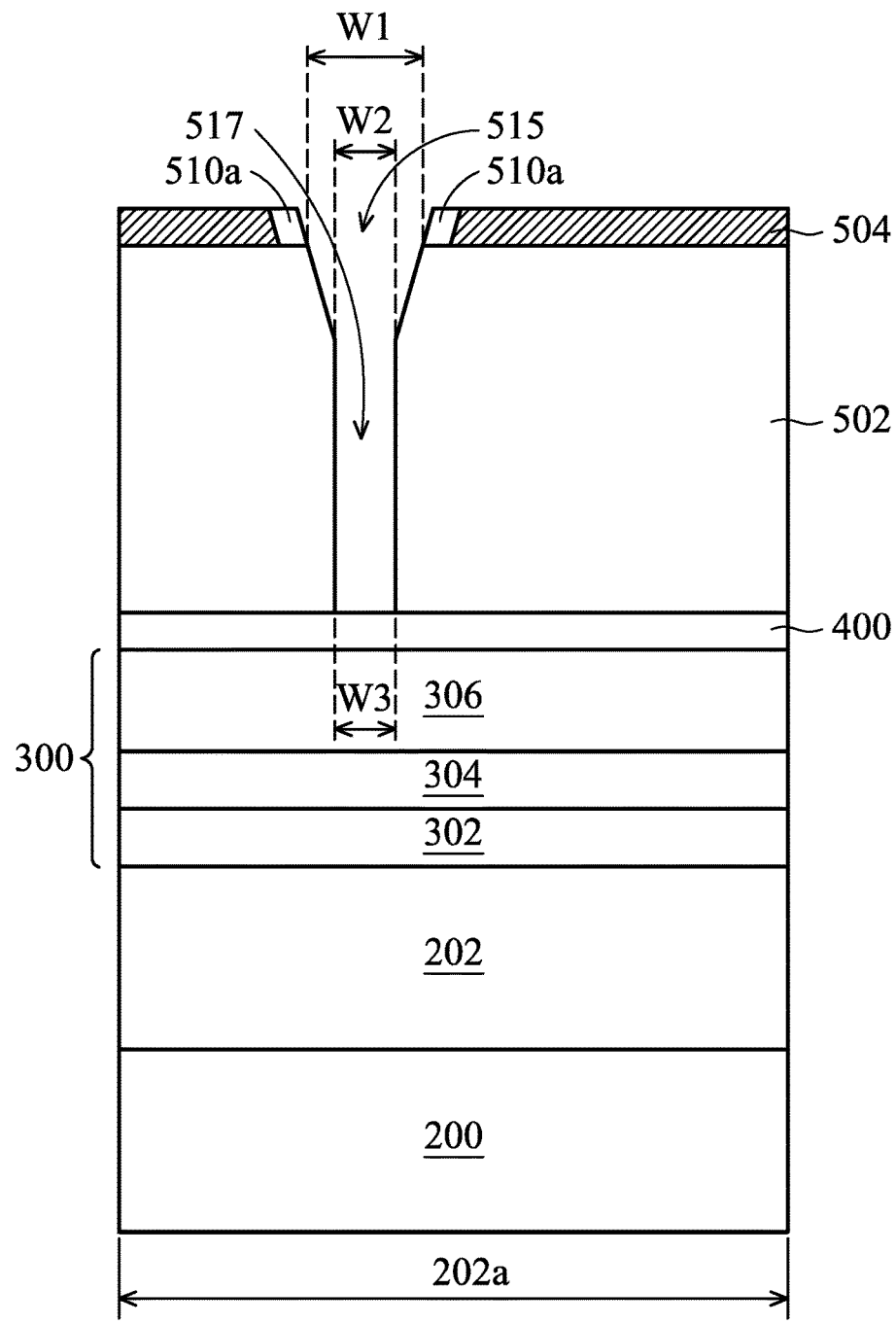

As shown in FIGS. 1 and 2F, the method 100 proceeds to step 112 by removing the first hard mask layer 502 below the bottom of the third tapered opening 515 in a second etching process using the second hard mask layer 504 and the remained passivation spacer 510a used as an etch mask to form an opening 517 with a vertical sidewall (which is also referred to as vertical opening) below the third tapered opening 515. As a result, a funnel-like opening is created by the third tapered opening 515 and the vertical opening 517. The funnel-like opening may improve the gap filling ability for subsequent processes. In some embodiments, the vertical opening 517 may expose the spacer layer 400. Moreover, the vertical opening 517 has a width W3 that is substantially equal to the bottom width W2 of the third tapered opening 515.

In some embodiments, the second etching process is performed using a fourth process gas including hydrogen ($H_2$) and a fifth process gas including nitrogen ($N_2$) to form the vertical opening 517 without enlarge the bottom width W2 of the third tapered opening 515. In particular, the $H_2$ gas prevents the first hard mask layer 502 from being isotropically etched, so as to keep the width W3 substantially equal to the bottom width W2 of the third tapered opening 515.

For example, the flow rate of the fourth process gas (e.g., $H_2$ gas) may be in a range from about 25 sccm to 40 sccm and that of the fifth process gas (e.g., $N_2$ gas) may be in a range from about 200 sccm to 320 sccm. In those cases, the gas-flow ratio between the fifth process gas and the fourth process gas may be about 8.

Figure 2G:
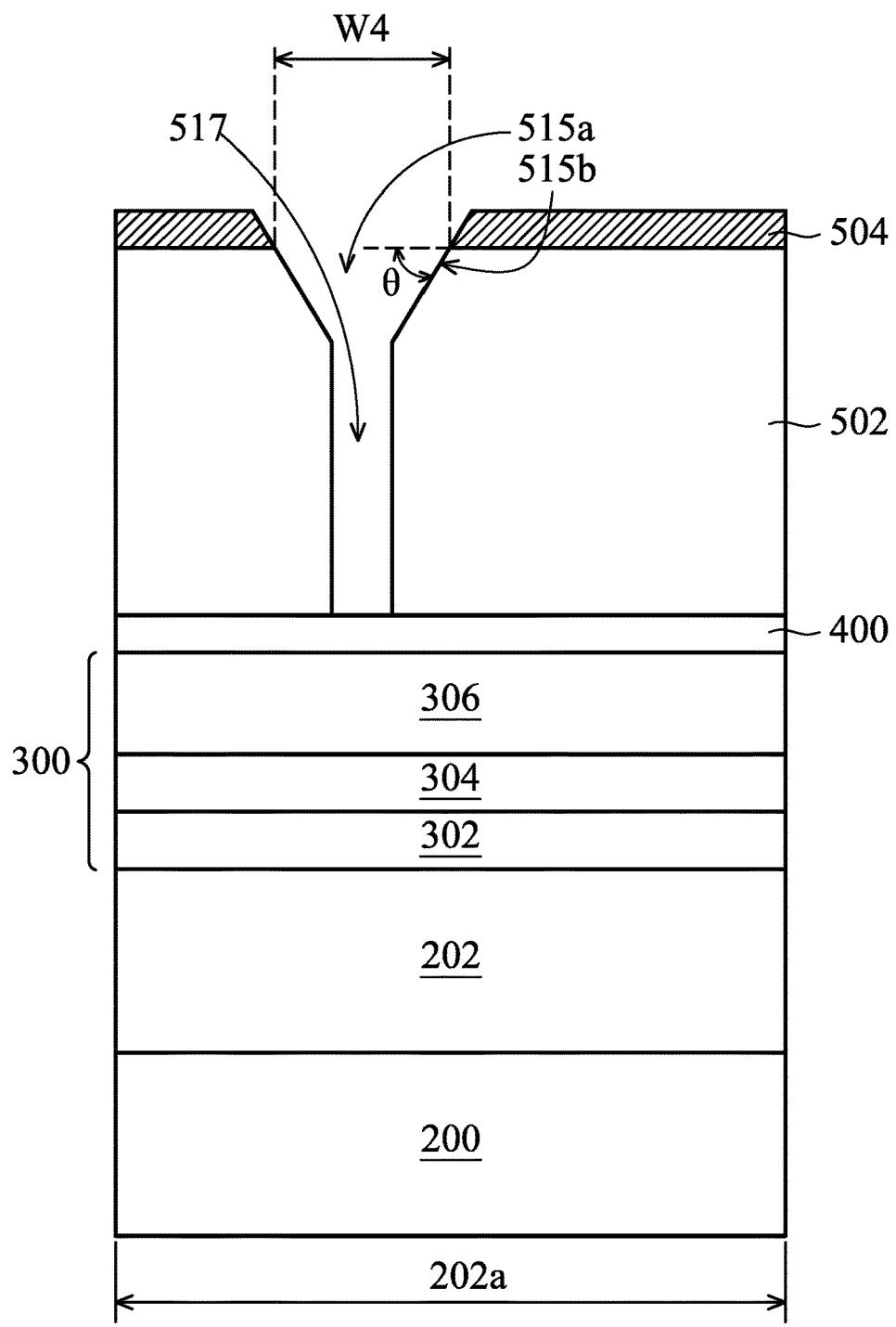

As shown in FIGS. 1 and 2G, the method 100 proceeds to step 114 by removing the remained passivation spacer 510a, a portion of the sidewall of the extended first tapered opening 507b (as indicated in FIG. 2C), and a portion of a sidewall of the third tapered opening 515 (as indicated in FIG. 2F) by a third etching process, so as to widen the top width W1 of the third tapered opening 515.

In some embodiments, the third etching process is performed using sixth and seventh process gases comprising fluorocarbon (such as $CF_4$, $C_3F_8$, $C_4F_8$, $CH_2F_2$, $CHF_3$, or the like). For example, the sixth process gas for the third etching process includes $CF_4$ and the seventh process gas for the third etching process includes $CHF_3$, in which a flow rate of the $CF_4$ gas is in a range from about 50 sccm to 150 sccm and that of the $CHF_3$ gas is in a range from about 50 sccm to 150 sccm. In those cases, the gas-flow ratio between the sixth process gas and the seventh process gas may be about 1. As a result, a widened third tapered opening 515a with a widened top width W4 is formed. In some embodiments, the bottom width W2 (or the width W3 as indicated in FIG. 2F) is in a range from about 10 nm to 30 nm and a ratio of the widened top width W4 to the bottom width W2 (or the width W3 as indicated in FIG. 2F) is in a range from about 2 to 5. The widened third tapered opening 515a may further improve the gap filling ability for subsequent processes compared to the funnel-like opening shown in FIG. 2F. In some embodiments, a top corner 515b of the widened third tapered opening 515a has an angle θ that is defined between the top and the sidewall of the widened third tapered opening 515a. To obtain a funnel-like opening with good gap filling ability for subsequent processes, the angle θ may be in a range from about 50° to 70°. If the angle θ is greater than 70°, the gap filling ability is reduced. Conversely, if the angle θ is less than 50°, it is benefit to the gap filling ability. However, more amount of masking material is need for the subsequent opening filling process, so as to increase manufacturing cost.

Figure 2H:
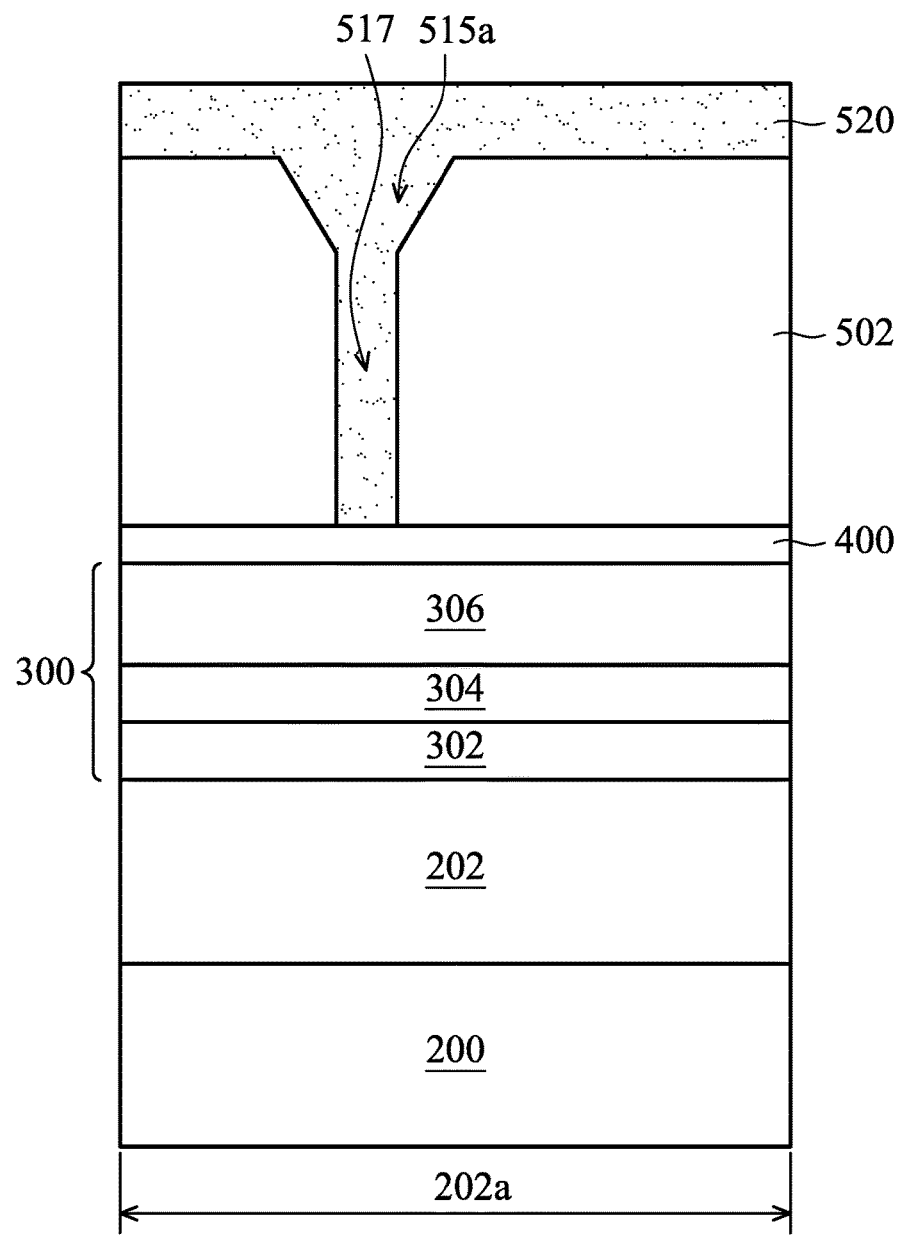

As shown in FIGS. 1 and 2H, the method 100 proceeds to step 116 by forming a masking material 520 in the widened third tapered opening 515a and the vertical opening 517. In accordance with embodiments, the second hard mask layer 504 is removed to expose the first masking layer 502 by an etching process prior to formation of the masking material 520. The etching process may include a wet etching process, a dry etching process or a combination thereof. As an example, a dry etching process may implement fluorine-containing gas (such as $CF_4$, $C_3F_8$, $C_4F_8$, $CH_2F_2$, $CHF_3$, or the like).

Afterwards, the masking material 520 is formed over the first masking layer 502 and fills the widened third tapered opening 515a and the vertical opening 517 without forming any voids therein, in accordance with embodiments. In alternative embodiments, the masking material 520 is formed over the second masking layer 504 and fills the widened third tapered opening 515a and the vertical opening 517. In some embodiments, the masking material 520 includes low temperature oxide (LTO), a resist material, or another suitable sacrificial material for the subsequent etch processes.

Figure 2I:
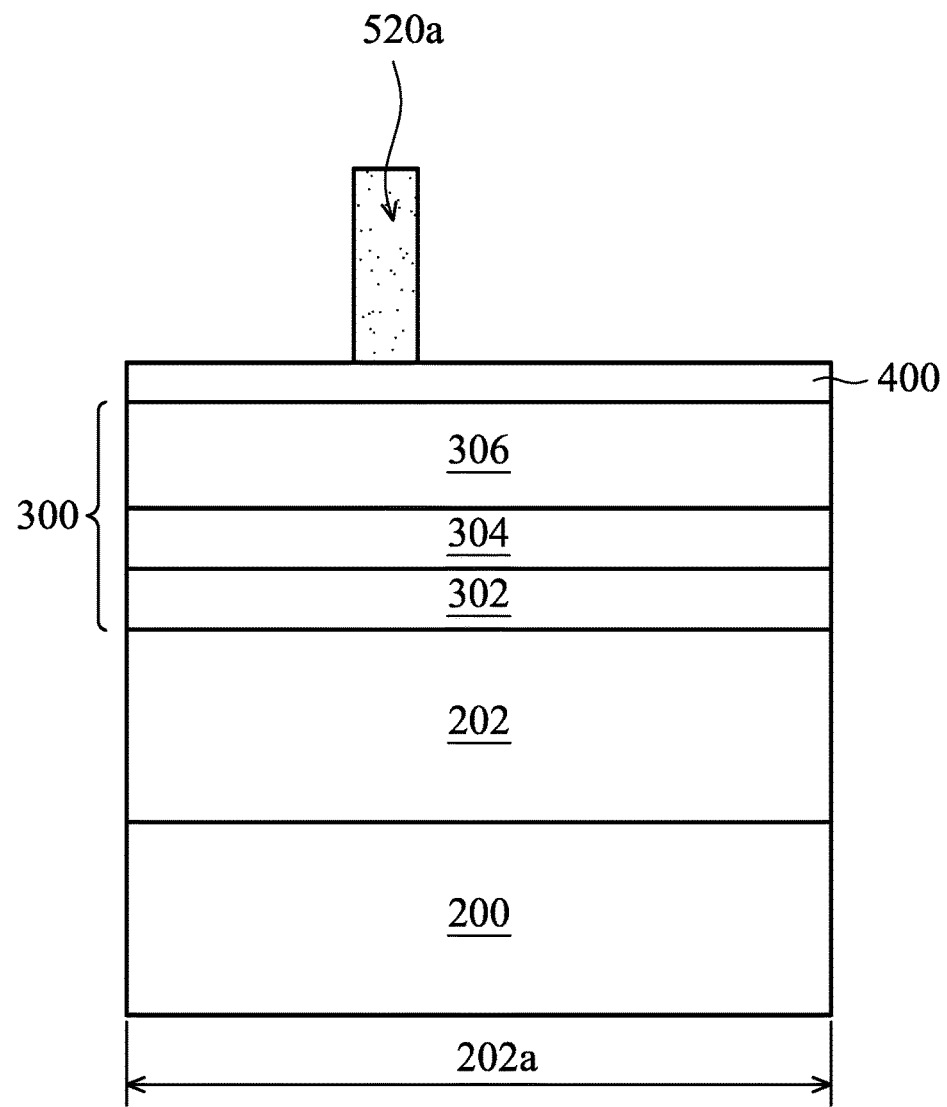

As shown in FIGS. 1 and 2I, the method 100 proceeds to step 118 by removing the first hard mask layer 502 by an etching process. The etching process also removed a portion of the masking material 520 that is formed over the first hard mask layer 502. As a result, a portion of the masking material 520a is left over in the spacer layer 400. In some embodiments, the etching process may include a wet etching process, a dry etching process or a combination thereof.

Figure 2J:
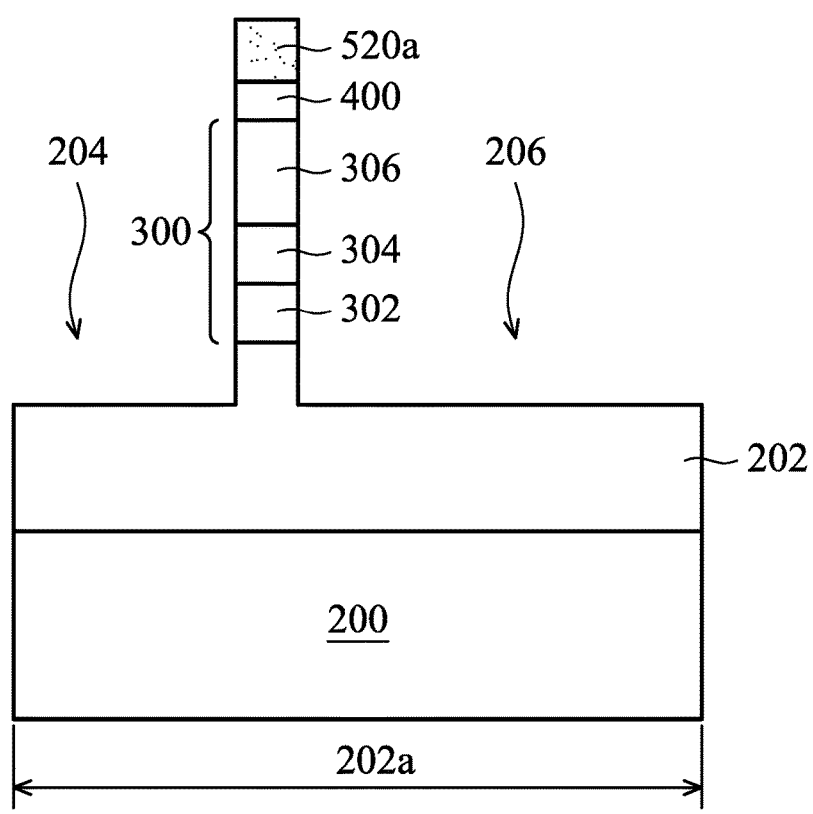

As shown in FIGS. 1 and 2J, the method 100 proceeds to step 120 by removing a portion of the hard mask structure 300 and the underlying material layer 202 that corresponds to the trench pattern region 202a and is exposed by the remaining masking material 520a, so as to form two trenches 204 and 206 in the material layer 202 that are separated by the remaining masking material 520a. In some embodiments, the hard mask structure 300 is patterned prior to the removal of the spacer layer 400 corresponding to the trench pattern region 202a and exposed from the remaining masking material 520a. In some embodiments, the spacer layer 400 and the underlying hard mask structure 300 are patterned by one or more etching processes including a wet etching process, a dry etching process or a combination thereof, so as to form a target pattern (such as two trench patterns) therein.

The target pattern defined in the spacer layer 400 and the underlying hard mask structure 300 is transferred into the material layer 202 by an etching process to form the trenches 204 and 206, in accordance with some embodiments. In some embodiments, the etching process includes a wet etching process, a dry etching process or a combination thereof.

Figure 2K:
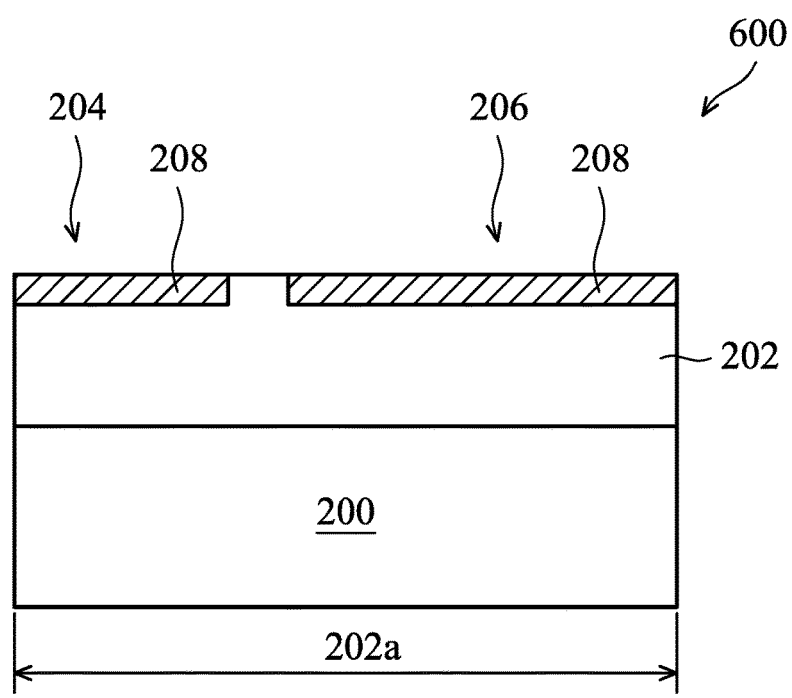

As shown in FIGS. 1 and 2K, after removing the remaining masking material 520a, the underlying spacer layer 400, and the underlying hard mask structure 300, the method 100 proceeds to step 122 by forming a conductive material 208 in each of the trenches 204 and 206 by, for example, ALD, PVD, CVD, and/or another suitable process, to form conductive features. In some embodiments, the conductive material 208 includes metal (such as copper, tungsten, or aluminum) or another suitable interconnect or wiring material. In accordance with some embodiments, the conductive features formed in the trenches 204 and 206 of the semiconductor device structure 600 may have substantially the same depth and substantially the same critical dimension (CD). Moreover, these conductive features are separated from each other.

Embodiments of the disclosure provide formation methods of a semiconductor device structure. According to some embodiments of the disclosure, since there is a funnel-like opening is formed over the spacer layer, the gap filling ability can be increased. As a result, a masking material can be filled into the funnel-like opening without voids therein, and thus damage of the hard mask structure below the spacer layer can be mitigated or eliminated. Namely, a target pattern can be precisely and successfully transferred into the hard mask structure and the underlying material layer.

Moreover, since a descum process is performed prior to patterning the second hard mask layer, under-etch of the second hard mask layer and the impact of the following patterning processes can be eliminated.

Additionally, the passivation spacer provided in the first plasma process can narrow the enlarged and undesired CD due to the descum process. As a result, although the descum process is performed prior to patterning the second hard mask layer, a desired CD can be obtained for the following patterning processes.

In accordance with some embodiments, a method of forming a semiconductor device structure is provided. The method includes successively forming a first hard mask layer and a second hard mask layer over a trench pattern region of a material layer. The second hard mask layer has a first tapered opening corresponding to a portion of the trench pattern region and a passivation spacer is formed on a sidewall of the first tapered opening to form a second tapered opening surrounded by the passivation spacer. The method also includes forming a third tapered opening with a top width and a bottom width in the first hard mask layer below the second tapered opening and removing a portion of the passivation spacer in a first etching process. The method also includes forming a vertical opening in the first hard mask layer below the bottom of the third tapered opening in a second etching process. The vertical opening has a width that is substantially equal to the bottom width of the third tapered opening.

In accordance with some embodiments, a method of forming a semiconductor device structure is provided. The method includes depositing a first hard mask layer and an overlying second hard mask layer over a trench pattern region of a material layer. The first hard mask layer includes a carbon-containing material and the second hard mask layer includes a silicon-containing material. The method also includes forming a first tapered opening in the second hard mask layer and a passivation spacer on a sidewall of the first tapered opening in a first plasma process using first and second process gases including fluorocarbon, so as to form a second tapered opening surrounded by the passivation spacer. The first tapered opening corresponds to a portion of the trench pattern region. The method also includes removing a portion of the first hard mask layer below the second tapered opening and a portion of the passivation spacer in a first etching process using a third process gas including oxygen, so that a third tapered opening is formed in the first hard mask layer. The method also includes removing the first hard mask layer below the bottom of the third tapered opening in a second etching process using a fourth process gas including hydrogen, so that an opening with a vertical sidewall is formed below the third tapered opening.

In accordance with some embodiments, a method of forming a semiconductor device structure is provided. The method includes depositing a first hard mask layer and an overlying second hard mask layer over a trench pattern region of a material layer. The method also includes forming a patterned resist layer having a first tapered opening over the second hard mask layer and corresponding to a portion of the trench pattern region. The method also includes extending the first tapered opening into the second hard mask layer and forming a passivation spacer on a sidewall of the extended first tapered opening in a first plasma process, so as to form a second tapered opening surrounded by the passivation spacer. The method also includes removing a portion of the first hard mask layer below the second tapered opening, the patterned resist layer, and a portion of the passivation spacer in a first etching process, so as to form a third tapered opening with a top width and a bottom width in the first hard mask layer. The method also includes removing the first hard mask layer below the bottom of the third tapered opening in a second etching process, so that a vertical opening with a width that is substantially equal to the bottom width of the third tapered opening is formed below the third tapered opening. The method also includes removing a portion of the sidewall of the first tapered opening and a portion of a sidewall of the third tapered opening in a third etching process, so as to widen the top width of the third tapered opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device structure, comprising:
    depositing a first hard mask layer and an overlying second hard mask layer over a trench pattern region of a material layer;
    forming a patterned resist layer having a first tapered opening over the second hard mask layer and corresponding to a portion of the trench pattern region;
    extending the first tapered opening into the second hard mask layer and forming a passivation spacer on a sidewall of the extended first tapered opening in a first plasma process, so as to form a second tapered opening surrounded by the passivation spacer;
    removing a portion of the first hard mask layer below the second tapered opening, the patterned resist layer, and a portion of the passivation spacer in a first etching process, so as to form a third tapered opening with a top width and a bottom width in the first hard mask layer;
    removing the first hard mask layer below the bottom of the third tapered opening in a second etching process, so that a vertical opening with a width that is substantially equal to the bottom width of the third tapered opening is formed below the third tapered opening;
    removing a portion of the sidewall of the first tapered opening and a portion of a sidewall of the third tapered opening in a third etching process, so as to widen the top width of the third tapered opening; and
    performing a second plasma process after forming the second tapered opening and before forming the third tapered opening.

2. The method as claimed in claim 1, further comprising;
    removing the second hard mask layer to expose the first hard mask layer;
    forming a masking material in the widened third tapered opening and the vertical opening;
    removing the first hard mask layer to leave the masking material;
    removing a portion of the material layer corresponding to the trench pattern region and exposed from the remaining masking material, so as to form two trenches in the material layer and separated by the remaining masking material; and
    forming a conductive material in each of the trenches.

3. The method as claimed in claim 1, wherein a top corner of the third tapered opening after widening the top width thereof has an angle that is in a range from about 50° to 70° or a ratio of the widened top width to the bottom width is in a range from about 2 to 5.

4. The method as claimed in claim 1, wherein the formation of the patterned resist layer comprises:
    coating a resist layer over the second hard mask layer;
    forming an opening in the resist layer via a lithography process, and performing a descum process to remove residual resist in the opening and a portion of a sidewall of the opening so as to form the first tapered opening.

5. The method as claimed in claim 1, wherein the first hard mask layer comprises an organic polymer free of silicon and the second hard mask layer comprises a silicon-containing material.

6. A method of forming a semiconductor device structure, comprising:
depositing a first hard mask layer and an overlying second hard mask layer over a trench pattern region of a material layer, wherein the first hard mask layer comprises a carbon-containing material and the second hard mask layer comprises a silicon-containing material;
forming a first tapered opening in the second hard mask layer and a passivation spacer on a sidewall of the first tapered opening in a first plasma process using first and second process gases comprising fluorocarbon, so as to form a second tapered opening surrounded by the passivation spacer;
removing a portion of the first hard mask layer below the second tapered opening and a portion of the passivation spacer in a first etching process using a third process gas comprising oxygen, so that a third tapered opening is formed in the first hard mask layer;
removing the first hard mask layer below the bottom of the third tapered opening in a second etching process using a fourth process gas comprising hydrogen, so that an opening is formed below the third tapered opening; and
performing a second plasma process after forming the second tapered opening and before forming the third tapered opening.

7. The method as claimed in claim 6, wherein the third tapered opening has a top width and a bottom width and the method further comprises:
removing a portion of the sidewall of the first tapered opening and a portion of a sidewall of the third tapered opening in a third etching process after performing the second etching process, so as to widen the top width of the third tapered opening.

8. The method as claimed in claim 7, further comprising:
removing the second hard mask layer to expose the first hard mask layer;
forming a masking material in the widened third tapered opening and the opening;
removing the first hard mask layer to leave the masking material;
removing a portion of the material layer corresponding to the trench pattern region and exposed from the remaining masking material, so as to form two trenches in the material layer and separated by the remaining masking material; and
forming a conductive material in each of the trenches.

9. The method as claimed in claim 7, wherein a ratio of the widened top width to the bottom width is in a range from about 2 to 5.

10. The method as claimed in claim 7, wherein the third etching process is performed using fifth and sixth process gases comprising fluorocarbon.

11. The method as claimed in claim 6, wherein the second plasma process uses the first and second process gases and wherein a gas-flow ratio between the first and second process gases used in the first plasma process is lower than that used in the second plasma process.

12. The method as claimed in claim 6, wherein the second etching process is further performed using a fifth process gas comprising nitrogen.

13. A method of forming a semiconductor device structure, comprising:
successively forming a first hard mask layer and a second hard mask layer over a trench pattern region of a material layer, wherein the second hard mask layer has a first tapered opening corresponding to a portion of the trench pattern region and a passivation spacer is formed on a sidewall of the first tapered opening to form a second tapered opening surrounded by the passivation spacer, and wherein the first tapered opening and the passivation spacer are formed by a first plasma process;
forming a third tapered opening with a top width and a bottom width in the first hard mask layer below the second tapered opening and removing a portion of the passivation spacer in a first etching process;
forming a vertical opening in the first hard mask layer below a bottom of the third tapered opening in a second etching process, wherein the vertical opening has a width that is substantially equal to the bottom width of the third tapered opening;
performing a second plasma process after forming the second tapered opening and before forming the third tapered opening.

14. The method as claimed in claim 13, further comprising removing a portion of the sidewall of the first tapered opening and a portion of a sidewall of the third tapered opening in a third etching process after performing the second etching process, so as to widen the top width of the third tapered opening.

15. The method as claimed in claim 14, further comprising:
removing the second hard mask layer to expose the first hard mask layer;
forming a masking material in the widened third tapered opening and the vertical opening;
removing the first hard mask layer to leave the masking material;
removing a portion of the material layer corresponding to the trench pattern region and exposed from the remaining masking material, so as to form two trenches in the material layer separated by the remaining masking material; and
forming a conductive material in each of the trenches.

16. The method as claimed in claim 14, wherein a top corner of the third tapered opening after widening the top width thereof has an angle that is in a range from about 50° to 70°.

17. The method as claimed in claim 14, wherein the first hard mask layer comprises a carbon-containing material and the second hard mask layer comprises a silicon-containing material and wherein the third etching process is performed using first and second process gases comprising fluorocarbon.

18. The method as claimed in claim 13, wherein the first hard mask layer comprises a carbon-containing material and the second hard mask layer comprises a silicon-containing material and wherein the first plasma process is performed using first and second process gases comprising fluorocarbon.

19. The method as claimed in claim 18, wherein the second plasma process is performed using the first and second process gases, and wherein a gas-flow ratio between the first and second process gases used in the first plasma process is lower than that used in the second plasma process.

20. The method as claimed in claim 13, wherein the first hard mask layer comprises a carbon-containing material and the second hard mask layer comprises a silicon-containing material and wherein the first etching process is performed using a first process gas comprising oxygen and the second etching process is performed using a second process gas comprising hydrogen and a third process gas comprising nitrogen.

* * * * *